United States Patent
Ono

[11] Patent Number: 5,146,458
[45] Date of Patent: Sep. 8, 1992

[54] DATA TRANSFER CHECKING SYSTEM
[75] Inventor: Akihiko Ono, Kanagawa, Japan
[73] Assignee: Mitsubishi Denki Kabushiki Kaisha, Japan
[21] Appl. No.: 537,329
[22] Filed: Jun. 13, 1990
[30] Foreign Application Priority Data
Jun. 14, 1989 [JP] Japan .................. 1-151716
[51] Int. Cl.$^5$ ................ G06F 11/00; G11C 29/00
[52] U.S. Cl. .................... 371/21.2; 395/575
[58] Field of Search ............ 371/21.3, 21.1, 21.2, 371/16.1

[56] References Cited
U.S. PATENT DOCUMENTS

| | | | |
|---|---|---|---|
| 4,061,908 | 12/1977 | de Jonge et al. | 371/21.3 |
| 4,680,762 | 7/1987 | Hardee et al. | 371/21.2 |
| 4,683,568 | 7/1987 | Urban | 371/16.1 |
| 4,760,575 | 7/1988 | Watanabe | 371/21.2 |
| 5,023,874 | 6/1991 | Houston | 371/21.2 |

Primary Examiner—Jerry Smith
Assistant Examiner—Henry C. Lebowitz
Attorney, Agent, or Firm—Wolf, Greenfield & Sacks

[57] ABSTRACT

A data transfer checking system includes a unit for writing a checking data pattern which is not identical with the data to be written in the same memory area; a unit for writing the data over the checking data pattern; and a unit for checking the memory area to see if there remains the checking data pattern, thereby providing high speed, low cost checking of the initial microprogram loading or data write conditions in an electronic computer system.

23 Claims, 6 Drawing Sheets

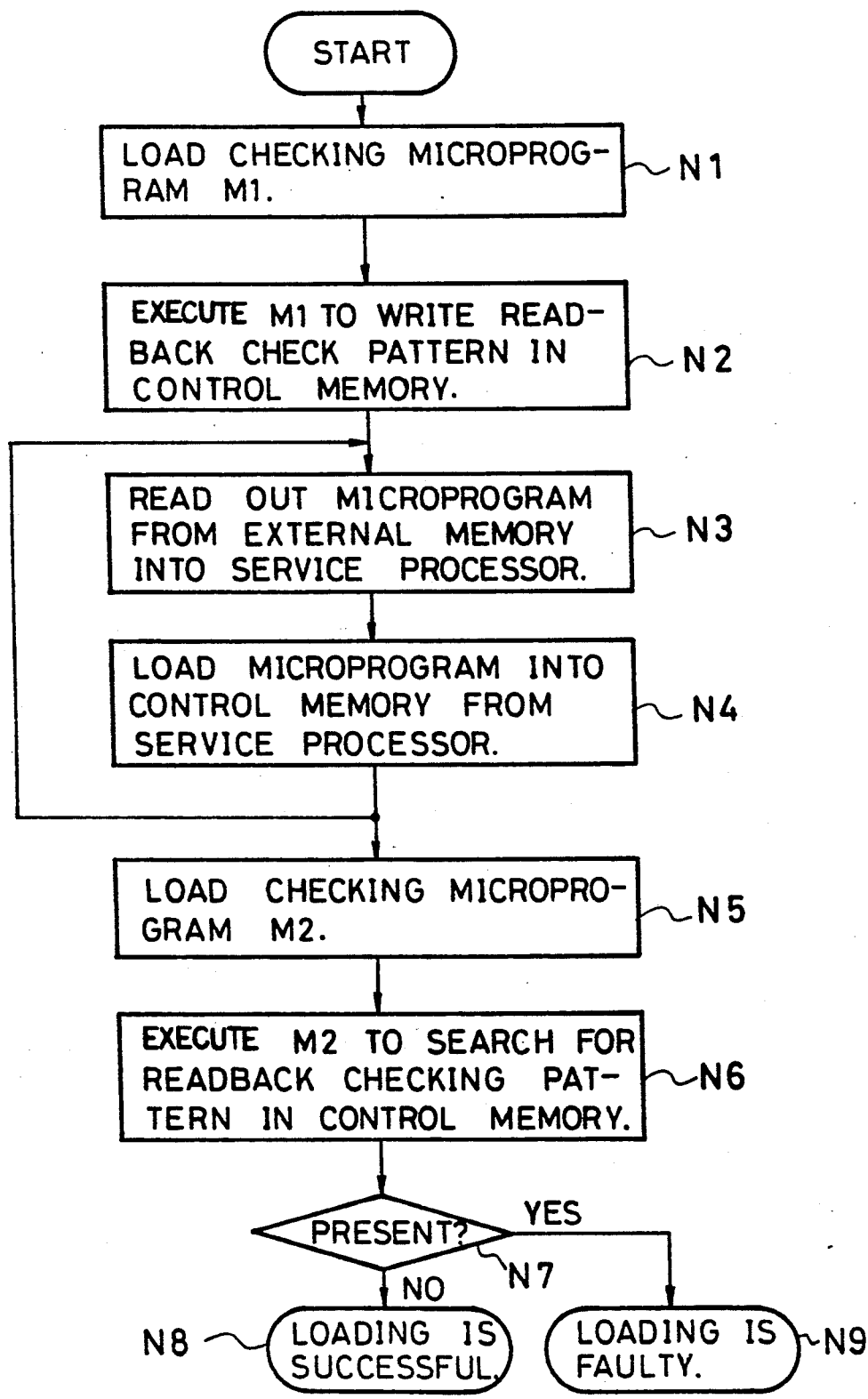

FIG. 3A
DATA PATTERN TO BE WRITTEN

|   |   |   |   |   |   |   |   |   |   |   |
|---|---|---|---|---|---|---|---|---|---|---|
| 0 | 0 | 0 | 0 | 0 | 1 | 0 | 0 | 0 | 0 | 1 |
| 1 | 0 | 0 | 0 | 1 | 0 | 0 | 0 | 0 | 1 | 0 |
| 2 | 0 | 0 | 0 | 1 | 1 | 0 | 0 | 0 | 1 | 1 |
| 3 | 0 | 0 | 1 | 0 | 0 | 0 | 0 | 1 | 0 | 0 |
| 4 | 0 | 0 | 1 | 0 | 1 | 0 | 0 | 1 | 0 | 1 |
| 5 | 0 | 0 | 1 | 1 | 0 | 0 | 0 | 1 | 1 | 0 |
| 6 | 0 | 0 | 1 | 1 | 1 | 0 | 0 | 1 | 1 | 1 |
| 7 | 0 | 1 | 0 | 0 | 0 | 0 | 1 | 0 | 0 | 0 |
| 8 | 0 | 1 | 0 | 0 | 1 | 0 | 1 | 0 | 0 | 1 |
| 9 | 0 | 1 | 0 | 1 | 0 | 0 | 1 | 0 | 1 | 0 |

FIG. 3B
CHECKING DATA STRING

| 1 | 1 | 1 | 1 | 0 | 1 | 1 | 1 | 1 | 1 |
|---|---|---|---|---|---|---|---|---|---|

FIG. 3C
BLANK MEMORY AREA 0
1
2
3
4
5
6
7
8
9

FIG. 3D
CHECKING DATA PATTERN WRITTEN

|   |   |   |   |   |   |   |   |   |   |   |
|---|---|---|---|---|---|---|---|---|---|---|
| 0 | 1 | 1 | 1 | 1 | 0 | 1 | 1 | 1 | 1 | 1 |
| 1 | 1 | 1 | 1 | 1 | 0 | 1 | 1 | 1 | 1 | 1 |
| 2 | 1 | 1 | 1 | 1 | 0 | 1 | 1 | 1 | 1 | 1 |
| 3 | 1 | 1 | 1 | 1 | 0 | 1 | 1 | 1 | 1 | 1 |
| 4 | 1 | 1 | 1 | 1 | 0 | 1 | 1 | 1 | 1 | 1 |
| 5 | 1 | 1 | 1 | 1 | 0 | 1 | 1 | 1 | 1 | 1 |
| 6 | 1 | 1 | 1 | 1 | 0 | 1 | 1 | 1 | 1 | 1 |
| 7 | 1 | 1 | 1 | 1 | 0 | 1 | 1 | 1 | 1 | 1 |
| 8 | 1 | 1 | 1 | 1 | 0 | 1 | 1 | 1 | 1 | 1 |
| 9 | 1 | 1 | 1 | 1 | 0 | 1 | 1 | 1 | 1 | 1 |

FIG. 3E
DATA PATTERN OVERWRITTEN SUCCESSFULLY

|   |   |   |   |   |   |   |   |   |   |   |
|---|---|---|---|---|---|---|---|---|---|---|
| 0 | 0 | 0 | 0 | 0 | 1 | 0 | 0 | 0 | 0 | 1 |
| 1 | 0 | 0 | 0 | 1 | 0 | 0 | 0 | 0 | 1 | 0 |
| 2 | 0 | 0 | 0 | 1 | 1 | 0 | 0 | 0 | 1 | 1 |
| 3 | 0 | 0 | 1 | 0 | 0 | 0 | 0 | 1 | 0 | 0 |
| 4 | 0 | 0 | 1 | 0 | 1 | 0 | 0 | 1 | 0 | 1 |
| 5 | 0 | 0 | 1 | 1 | 0 | 0 | 0 | 1 | 1 | 0 |
| 6 | 0 | 0 | 1 | 1 | 1 | 0 | 0 | 1 | 1 | 1 |
| 7 | 0 | 1 | 0 | 0 | 0 | 0 | 1 | 0 | 0 | 0 |
| 8 | 0 | 1 | 0 | 0 | 1 | 0 | 1 | 0 | 0 | 1 |
| 9 | 0 | 1 | 0 | 1 | 0 | 0 | 1 | 0 | 1 | 0 |

FIG. 3F
ADDRESS 0 DATA WRITTEN AT ADDRESS 2

```
0 | 1 1 1 1 0 1 1 1 1
1 | 1 1 1 1 0 1 1 1 1
2 | 0 0 0 0 1 0 0 0 0 1
3 | 1 1 1 1 0 1 1 1 1
4 |
5 |
6 |
7 |
8 |
9 | 1 1 1 1 0 1 1 1 1
```

FIG. 3G
DATA OVERWRITTEN AT ADDRESS 2

```
0 | 1 1 1 1 0 1 1 1 1
1 | 1 1 1 1 0 1 1 1 1
2 | 0 0 0 1 1 0 0 0 1 1
3 | 0 0 0 1 0 0 0 0 1 0
4 | 1 1 1 1 0 1 1 1 1
5 |
6 |
7 |
8 |
9 | 1 1 1 1 0 1 1 1 1
```

FIG. 3H
DATA WRITTEN UP TO ADDRESS 9 WITH CHECKING PATTERN LEFT AT ADDRESSES 0, 1, 4, 5, 8, AND 9

| CORRECT DATA | | | | | ERROR DATA | | | | |
|---|---|---|---|---|---|---|---|---|---|
| 0 | 0 0 0 0 | | | | 0 0 1 0 | | | | 2 |
| 1 | 0 0 0 1 | | | | 0 0 1 1 | | | | 3 |
| 2 | 0 0 1 0 | | | | 0 0 1 0 | | | | 2 |
| 3 | 0 0 1 1 | | | | 0 0 1 1 | | | | 3 |
| 4 | 0 1 0 0 | | | | 0 1 1 0 | | | | 6 |
| 5 | 0 1 0 1 | | | | 0 1 1 1 | | | | 7 |
| 6 | 0 1 1 0 | | | | 0 1 1 0 | | | | 6 |
| 7 | 0 1 1 1 | | | | 0 1 1 1 | | | | 7 |
| 8 | 1 0 0 0 | | | | 1 0 1 0 | | | | A |
| 9 | 1 0 0 1 | | | | 1 0 1 1 | | | | B |

DATA TRANSFER CHECKING SYSTEM

BACKGROUND OF THE INVENTION

1. Field of the Invention

The present invention relates to a data transfer checking system for checking if data is written correctly in the initial loading of a microprogram or the like in an electronic computer system.

2. Description of the Prior Art

FIG. 4 shows the essential part of a data transfer checking system for an electronic computer system. The checking system includes an electronic computer 1 having a processing unit 2 controlled by microprograms and a control memory 3 for storing microprograms; an external memory or storage 4 (hereinafter "external memory") for storing microprograms in files; a service processor 5 for controlling the processing unit 2 and performing the initial microprogram loading into the control memory 3 from the external memory 4; an input/output (I/O) unit 6 for inputting/outputting data or commands; a system bus 7 for transferring data between the service processor 5 and the control memory 3; and a processor bus 8 for interconnecting the service processor 5 and the processing unit 2.

FIG. 5 shows how the conventional data transfer checking system works. Microprograms to be stored in the control memory 3 for controlling the processing unit 2 have been stored in the external memory 4 in files. When initialization of the system is started by turning on the system or inputting a command into the service processor 5 through the I/O unit 6, the microprograms are stored in the control memory 3 by the initial microprogram loading process. The initial microprogram loading process can also be performed by inputting a command as described above.

A microprogram is read out of the external memory 4 into the service processor 5 (Step S1) and loaded into the control memory 3 via the system bus 7 (Step S2). These steps are repeated until all of the memory areas in the control memory 3 are loaded with microprograms.

Upon completion of the loading, the service processor 5 performs a readback checking procedure for checking if the microprograms are loaded correctly. That is, the service processor 5 reads out the contents of a microprogram in the control memory 3 via the system bus 7 (Step S3) and those of the external memory 4 corresponding to the contents (Step S4) to compare both of the contents (Step S5). These steps are repeated for all of the microprograms in the control memory 3. If all of the contents are matched (Step S6), the loading is a success (Step S7). If there is a mismatch, a loading error correcting procedure is performed (Step S8).

In the conventional data transfer checking system, the service processor 5 must read out the contents from the external memory 4 to compare them with the contents in the control memory 3, resulting in the increased number of data read cycles by the service processor 5. As a result, it is increasingly difficult to speed up the checking process of the contents of loaded microprograms.

SUMMARY OF THE INVENTION

Accordingly, it is an object of the invention to provide a data transfer checking system for checking at high speeds the write conditions of data, such as microprograms, with fewer data read cycles and no added costs.

In accordance with the invention there is provided a data transfer checking system for checking if a data pattern is written without error in the memory area of an erasable storage, which includes a unit for writing, before the data pattern is written, for each address a checking data pattern which is different from the data pattern at the addresses and a unit for finding if there is the checking data pattern left in the memory area. If no checking data pattern is found, it is determined that the loading operation is successful or normal.

The above and other objects, features, and advantages of the invention will become more apparent from the following description when taken in conjunction with the accompanying drawings.

BRIEF DESCRIPTION OF THE DRAWINGS

FIG. 2 is a flow chart useful for explaining how the data transfer checking system of FIG. 1 works;

FIG. 3A shows a data pattern to be written;

FIG. 3B shows a checking data string;

FIG. 3C shows a blank memory area;

FIG. 3D shows a checking data pattern written;

FIG. 3E shows a data pattern overwritten on the checking data pattern of FIG. 3D;

FIG. 3F shows a data pattern in which the data string to be written at address 0 has been written at address 2 by error;

FIG. 3G shows a data pattern in which a new data string is overwritten at address 2;

FIG. 3H shows a data pattern in which data are written up to address 9 with checking data strings left at addresses 0, 1, 4, 5, 8, and 9;

FIG. 3I shows a comparison between a right data pattern and a wrong data pattern;

DESCRIPTION OF THE PREFERRED EMBODIMENT

Figure 1:
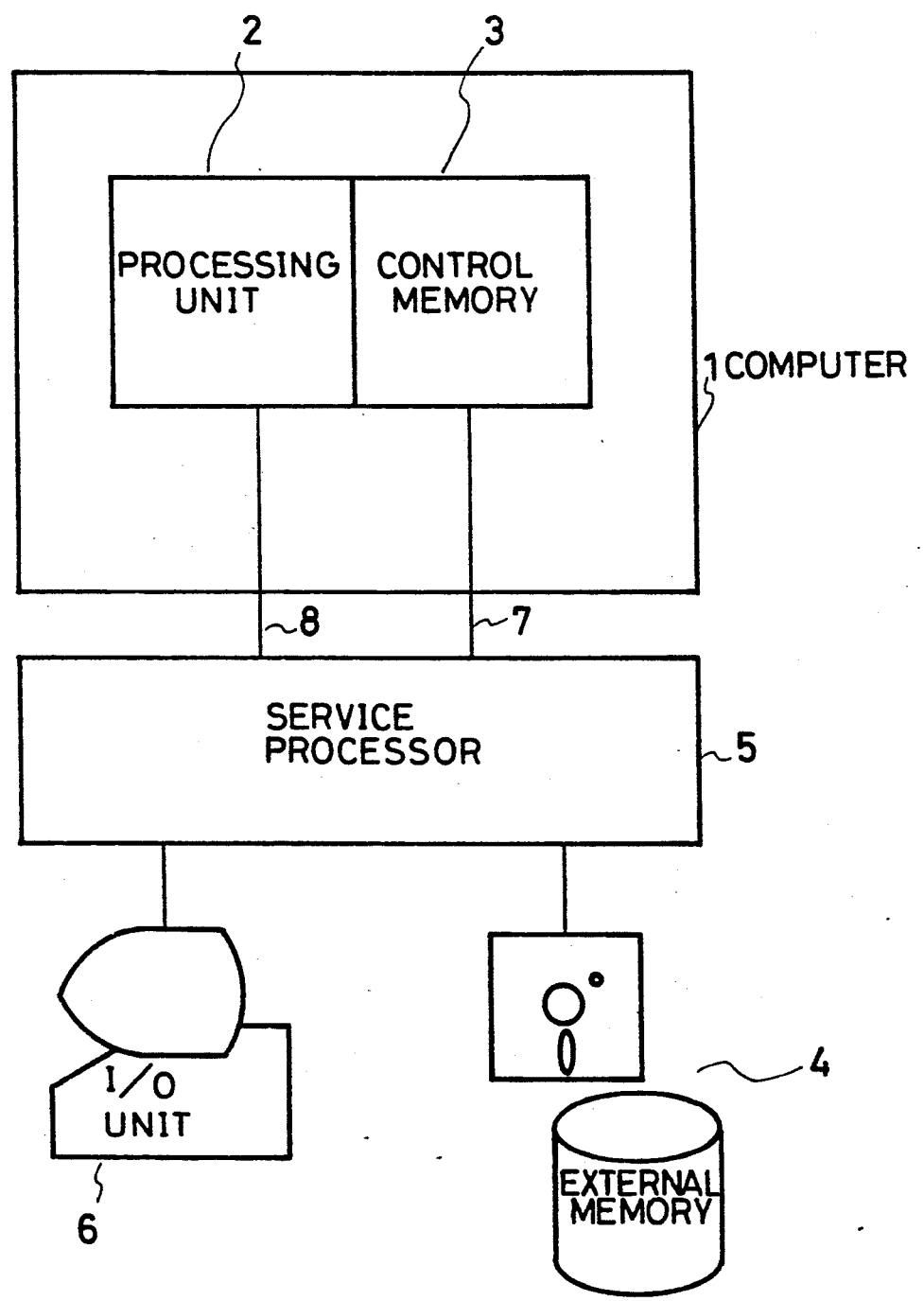
FIG. 1 is a block diagram of the essential part of a data transfer checking system according to an embodiment of the invention.
Figure 4:
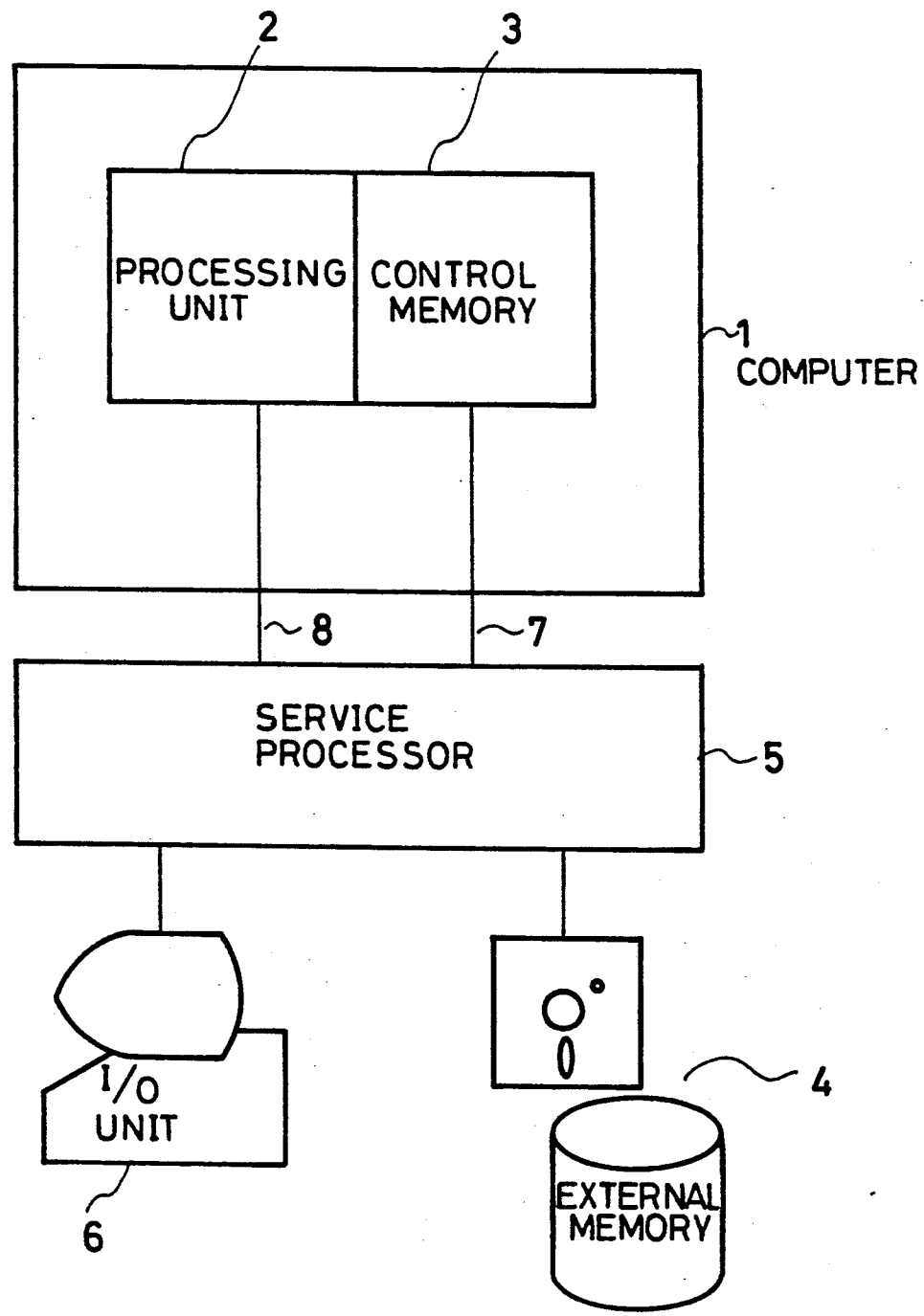
FIG. 4 is a block diagram of the essential part of a conventional data transfer checking system.
Figure 5:
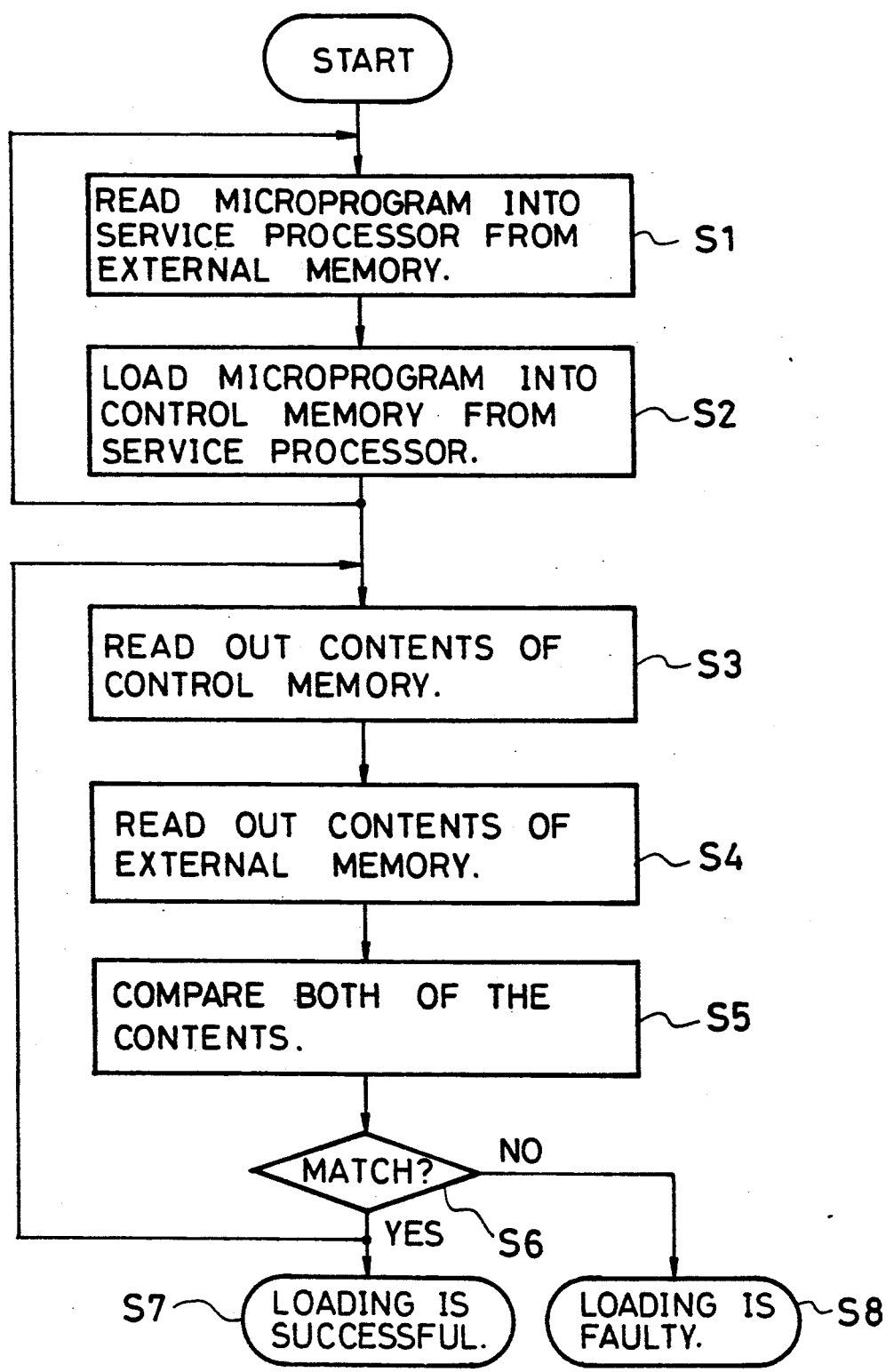
FIG. 5 is a flow chart useful for explaining how the conventional data transfer checking system works.

FIG. 1 shows a data transfer checking system according to an embodiment of the invention. The data transfer checking system includes a computer 1 having a processing unit 2 and a control or second memory 3; a processor or service processor 5 coupled with the computer 1 via a control line to control the computer 1 by transferring data and programs; an external or first memory 4 coupled to the processor 5 for storage; a first unit for sending the first program to the computer 1 so that the processing unit 2 executes it to load the control memory 3 with a predefined checking pattern; a loading unit for transferring data to the control memory 3 to overwrite the data on the predefined checking pattern; a second unit for sending the second program to the computer 1 so that the processing unit 2 executes it to check the control memory 3 if there is the predefined checking pattern left therein.

The external memory 4 includes data to be transferred to the control memory 3; a predefined checking pattern; the first program for placing the predefined checking pattern in the control memory 3; the second program for checking the control memory 3 to find if there is the predefined checking pattern left therein.

A data transfer checking system includes a defining unit for defining a checking pattern based on the data to be loaded. The defining unit includes a finding unit for finding the checking pattern which is different from the data pattern and a holding unit for holding the checking pattern as a predefined checking pattern. The checking pattern may include a plurality of different checking subpatterns or data strings. The finding unit includes a taking unit for taking one different column element from each row of the data pattern and a linking unit for linking together the different column elements of the data to generate a checking pattern. The taking unit includes a pick-up unit for picking up one column element on the diagonal line of the data pattern and an inverting unit for inverting the value of the picked-up element. The data transfer checking system has the processing unit which is able to execute programs as data.

FIG. 2 shows how the data transfer checking system of FIG. 1 works. A microprogram is loaded into the control memory 3 within the computer 1 from the external memory 4. The processor 5 stores in the control memory 3 via the system bus 7 a checking microprogram M1 for checking the load conditions of the microprogram in the control memory 3. This checking microprogram M1 is used to write in a predetermined memory area of the control memory 3 a checking data pattern which is not used for the microprogram.

When the loading of a checking microprogram M1 is completed (Step NI), the processor 5 starts the processing unit 2 via the processor bus 8. The processing unit 2 executes the checking microprogram M1 loaded in the control memory 3 and writes in a predetermined memory area of the control memory 3 a checking data pattern (hereinafter "readback checking pattern") which is different from the microprogram (Step N2). Thereafter, the data of the microprogram are loaded in the control memory 3 in the same manner as the conventional one. That is, the microprogram is read out of the external memory 4 into the processor 5 (Step N3) and loaded into the control memory 3 via the system bus 7 (Step N4). These steps are repeated until the predetermined memory area of the control memory 3 is loaded with the microprogram. In other words, the microprogram is written over the readback checking pattern.

A checking microprogram M2 for checking the load conditions of the microprogram is loaded in a reserved microprogram operation area in the control memory 3 via the system bus 7. This checking microprogram M2 is used to check the predetermined memory area of the control memory 3 to search for the readback checking pattern which has been written before the microprogram loading.

Upon the loading of the checking microprogram M2 is completed (Step N5), the processor 5 starts the processing unit 2 via the processor bus 8. The processing unit 2 executes the checking microprogram M2 to search for the readback checking pattern which is different from the microprogram in the predetermined memory area of the control memory 3 (Step N6). If the readback checking pattern is found (Step N7), a loading error correcting action is taken (Step N9), indicating that two or more pieces of data have been written at a certain address while no data is written at the address where the readback checking pattern has been detected. If the readback checking pattern is not found (Step N7), the loading of the microprogram is determined to be successful (Step N8).

The steps N1 and N2 are called "pattern storage procedure," the steps N3 and N4 "data overwrite procedure," the steps N5-N9 "pattern checking procedure," and the steps N7-N9 "decision procedure." Before the starting point in FIG. 1, there is a "pattern definition procedure" which consists of a pattern generating step for defining a readback checking pattern and a pattern storing step for storing the checking pattern.

In the above checking system, the processor bus 8 carries a command from the processor 5 to the processing unit 2 so that it is possible not only to control execution by the processing unit 2 through the processor 5 taut also to load a checking microprogram into the control memory 3 so that the processing unit 2 executes it to check if the microprogram is loaded correctly.

The operation of the data transfer checking system will be described with reference to FIGS. 3A–3I. FIG. 3A shows a data pattern to be written in the memory area of a storage unit such as the control memory 3. This data pattern corresponds to the microprogram to be loaded.

FIG. 3B shows a readback checking data string which is never used as data. The checking data string is made by inverting each of the bits which are present in the diagonal line of the data pattern to be written in FIG. 3A. With this technique it is possible to make a checking data string which is not identical with any row of the data pattern to be written.

The checking data string of FIG. 3B is written in the blank memory area of FIG. 3C to form a checking data pattern as shown in FIG. 3D. Then, the data pattern of FIG. 3A is written over the checking data pattern of FIG. 3D to form a complete data pattern as shown in FIG. 3E. If the writing is made correctly, no checking data string of FIG. 3b should be found.

If there is a fault such that the bit 2 of an address designation register is fixed to "1", the data pattern of FIG. 3A at address 0 is written over the checking data pattern of FIG. 3D to form a data pattern as shown in FIG. 3F. The data pattern at address 2 is written over again to form a data pattern as shown in FIG. 3G. In this way, the data pattern is written up to the last address 9 to form a data pattern as shown in FIG. 3H, in which the checking data string of FIG. 3B remains at addresses 0, 1, 4, 5, 8, and 9, indicating that this data writing is faulty. The address errors are shown in FIG. 3I, wherein A and B represent addresses outside the memory area. (Note: this example assumes that the malfunction of the address designation register occurs after the checking pattern is written to the memory but before the data pattern is written to the memory.)

The data transfer checking system, which is used to check if a microprogram is loaded correctly in the above embodiment, may be used to check if data is written in a predetermined address. The external memory and the control memory, into which microprograms/data are loaded from the external memory, may be any type of storage. The locations in which microprograms/data are stored and loaded are not necessarily in separate storage but may be in different areas within the same memory space.

The checking pattern which is never identical with the microprogram may be made as follows: Where programs or files are data, it is common that columns are combined to form fields, each of which contains a few columns, and the values entered in each field are restricted to only letters from A to Z or numbers. In this case, a readback checking pattern may be made by applying the numerical data pattern to the fields of only alphabetical data or the alphabetical data pattern to the fields of only numerical data.

Only a single type of readback checking string has been used in the above embodiment, but a plurality of types of readback checking strings may be used. If the data pattern to be written contain all of the writable patterns, it may be divided into two data patterns for each of which a readback checking pattern is provided. More specifically, if the data pattern to be written is 8 bits long and has data values 0-255, it is divided into two sections so that not all of the values 0-255 is contained in each section, thus permitting that a readback checking pattern is formed.

The formation of the checking pattern is not dynamic. For example, it may be formed when a microprogram is formed. In the system of FIG. 1, it is sufficient to form only the first checking pattern, and the first checking pattern may be used for subsequent executions. Consequently, the checking pattern may be formed in either this or another system. Although it is necessary to form it once before loading according to the invention, it is unnecessary to repeat it every time loading is made.

As has been described above, according to the invention, a given data pattern is written after a checking data pattern, which is not present at the address of the data pattern, is written at each address, and if the checking data pattern is not found in the later checking stage, it is determined that the loading operation has been done normally, so that the write conditions are checked at high speeds in software with little or no increase in the unit manufacturing cost.

I claim:

1. A data transfer checking system comprising:
   (a) a first memory for storing a first program, a second program, and a transferring program;
   (b) a second memory;
   (c) a processing means for executing programs, comprising:
      (i) means for executing the first program to store a checking pattern in said second memory;
      (ii) means for executing the transferring program to transfer information stored in said first memory to said second memory to overwrite said checking pattern; and
      (iii) means for executing the second program to search said second memory for said predefined checking pattern subsequent to said overwritting to locate a data transfer error.

2. A data transfer checking system comprising:
   (a) a memory including:
      (a1) a first memory area for storing information and a predefined checking pattern;
      (a2) a second memory area for receiving information from said first memory area;
   (b) storing means for storing said predefined checking pattern in said second memory area;
   (c) transferring means for transferring information into said second memory area to overwrite said checking pattern; and
   (d) checking means for reading back said second memory area to search for said predetermined checking pattern therein subsequently said overwritting.

3. A data transfer checking system comprising:
   (a) a computer having a processing unit;
   (b) a processor coupled with said computer to control said computer by transferring data and a program to said computer;
   (c) a storage comprising a first memory coupled to said processor for storing information to be transferred to a second memory, a predefined checking pattern, a first program for placing said predefined checking pattern in said second memory, and a second program for checking said second memory to search for said predefined checking pattern in said second memory;
   (d) first means for sending said first program to said computer so that said processing unit executes said first program to load said second memory with said predetermined checking pattern;
   (e) loading mean for transferring said data to said second memory to overwrite said information on said predefined checking pattern; and
   (f) second means for sending said second program to said computer so that said processing unit executes said second program to check said second memory to search for said predefined checking pattern therein subsequent to said overwriting.

4. The data transfer checking system of claim 1, 2, or 3, which further comprises defining means for defining said checking pattern based on said information to be transferred to said second memory.

5. The data transfer checking system of claim 4, wherein said defining means comprises:
   (a) finding means or finding said checking pattern which is not identical with said information; and
   (b) holding means for holding said checking pattern as said predefined checking pattern.

6. The data transfer checking system of claim 5, wherein said finding means comprises:
   (a) selection means for selecting one different column element of said information from each row of said information; and
   (b) means for copying said different selected column elements and linking together said copies of different selected column elements to generate a checking string.

7. The data transfer checking system of claim 6, wherein said selection means comprises:
   (a) copying means for copying one column element on a diagonal line of said information; and
   (b) inverting means for generating a value equal to an inverse of said copied element.

8. The data transfer checking system of claim 4, wherein said checking pattern comprises a plurality of different checking subpatterns.

9. The data transfer checking system of claim 3, wherein said information constitutes a program to be executed by said processing unit.

10. A data transfer checking method for checking whether transfer of data from a first memory to a second memory is successful, comprising the steps of:
    (a) storing a checking pattern in said second memory;
    (b) transferring data from said first memory to said second memory to overwrite said data on said checking pattern;
    (c) checking said second memory to search for said checking pattern therein.

11. The data transfer checking method of claim 10, which further comprises the step of defining said checking pattern such that is never identical with said data.

12. The data transfer checking method of claim 11, wherein said defining step comprises the step of:
   generating said checking pattern based on values of a plurality of elements of said data.

13. The data transfer checking method of claim 10, wherein said storing step comprises the steps of:
   (a) loading in the first memory a first program for writing said checking pattern in said second memory; and
   (b) executing said first program to write said checking pattern;
   said trnsferring step comprising the steps of:
      reading out said data from said first memory; and
      loading said data in said second memory to overwrite said data on said checking pattern;
   said checking step comprises the steps of:
      loading a second program for finding said checking pattern in said second memory;
      executing said second program to search for said checking pattern; and
      deciding whether said transferring step is done successfully.

14. The data transfer checking method of claim 10, wherein said storing step comprises the steps of:
   (a) loading in the first memory a first program for writing said checking pattern in said second memory; and
   (b) executing said first program to write said checking pattern.

15. The data transfer checking method of claim 10 or 14, wherein said transferring step comprises the steps of:
   (a) reading out said data from said first memory; and
   (b) loading said data in said second memory to overwrite said data on said checking pattern.

16. The data transfer checking method of claim 10 or 14, wherein said checking site comprises the steps of:
   (a) loading in the first memory a second program for finding said checking pattern in said second memory;
   (b) executing said second program to search for said checking pattern; and
   (c) deciding whether said transferring step is done successfully.

17. A data transfer checking method for confirming validity of data transferred form a first system having a list processor and a first memory containing a data/program to be transferred and a checking pattern to a second system having a second processor and a second memory and coupled to said first system via signal lines, said method comprising the steps of:
   (a) storing said checking pattern from said first memory to said second memory;
   (b) transferring said data from said first memory to said second memory to overwrite said data on said checking pattern; and
   (c) checking said second memory to search for said checking pattern.

18. The data transfer checking method of claim 17, which further comprises the step of defining said checking pattern so that it does not appear in said data.

19. The data transfer checking method of claim 18, wherein said defining step comprises the step of:
   generating said checking pattern based on values of a plurality of elements of said data.

20. The data transfer checking method of claim 17, wherein said storing step comprises the steps of:
   loading in the first memory a first program for writing said checking pattern in said second memory using said first processor via signal line; and
   executing said first program at said second system on said second processor to write said checking pattern to said second memory;
   said transferring step comprising the steps of:
      reading said data from said first memory with said first processor; and
      loading said data in said second memory via signal lines using said first processor to overwrite said data on said checking pattern; and
   said checking step comprising the steps of:
      loading a second program for finding said checking pattern in said second memory via signal lines from said first memory;
      executing said second program at said second system with said second processor to search for said checking pattern; and
      deciding whether said transferring step is done successfully.

21. The data transfer checking method of claim 17, wherein said storing step comprises the step of:
   (a) loading in the first memory a first program for writing said checking pattern in said second memory using said first processor via signal lines; and
   (b) executing said first program in said second system to write said checking pattern in said second memory.

22. The data transfer checking method of claim 17 or 21, wherein said transferring step comprises the steps of:
   (a) reading said data from said first memory with said first processor; and
   (b) loading said data in said second memory via signal lines using said first processor to overwrite said data on said checking pattern.

23. The data transfer checking method of claim 17 or 21, wherein said checking step comprises the steps of:
   (a) loading in the first memory a second program for finding the checking pattern in said second memory via signal lines from said first memory;
   (b) executing said second program on said second processor to search for said checking pattern; and
   (c) deciding whether said overwrite is done successfully.

* * * * *